United States Patent [19]
Kobayashi

[11] Patent Number: 5,818,759
[45] Date of Patent: Oct. 6, 1998

[54] NON-VOLATILE SEMICONDUCTOR MEMORY DEVICE

[75] Inventor: Yasuhiro Kobayashi, Gifu, Japan

[73] Assignee: Sanyo Electric Co., Ltd., Osaka, Japan

[21] Appl. No.: 807,659

[22] Filed: Feb. 27, 1997

[30] Foreign Application Priority Data

Feb. 29, 1996 [JP] Japan ..................................... 8-042869

[51] Int. Cl.[6] .............................................. G11C 16/04
[52] U.S. Cl. .............................. 365/185.15; 365/185.2; 365/185.22; 365/210
[58] Field of Search ........................... 365/185.2, 185.18, 365/185.22, 210

[56] References Cited

U.S. PATENT DOCUMENTS 5,029,130  7/1991  Yeh ......................................... 365/185
5,566,111  10/1996  Choi ...................................... 365/185.2
5,596,526  1/1997  Assar et al. ......................... 365/185.22
5,659,503  8/1997  Sudo et al. ............................ 365/185.2

FOREIGN PATENT DOCUMENTS

WO92/18980  10/1992  WIPO .

*Primary Examiner*—Son T. Dinh
*Attorney, Agent, or Firm*—Sheridan Ross P.C.

[57] ABSTRACT

A semiconductor memory device includes a plurality of memory cells each having a control gate, a source, a drain and a floating gate. A write control unit controls voltages applied to the control gates, the sources and the drains to write data in each memory cell. A write-current determining circuit is connected to the write control unit, for determining a write current flowing in the floating gate of each memory cell and controlling the write control unit in accordance with a determination result, such that data is written in each memory cell with a predetermined write current.

31 Claims, 14 Drawing Sheets

Fig.7 (Prior Art)

| Operation mode | Write | Erase | Read | Standby |
|---|---|---|---|---|
| Word line WLm (Control gate CG) | +2V | +14 to +15V | +4V | 0V |
| Bit line BLm (Drain D) | 0V | 0V | +2V | 0V |
| Common source line SL (Source S) | +12V | 0V | 0V | 0V |
| Substrate 102 | 0V | 0V | 0V | 0V |

Fig.10 (Prior Art)

| Operation mode | Write | Erase | Read | Standby |
|---|---|---|---|---|
| Word line WLm (Control gate CG) | +2V | +14 to +15V | +4V | 0V |
| Bit line BLm (Drain D) | +12V | 0V | +2V | 0V |
| Common source line SL (Source S) | 0V | 0V | 0V | 0V |
| Substrate 102 | 0V | 0V | 0V | 0V |

NON-VOLATILE SEMICONDUCTOR MEMORY DEVICE

BACKGROUND OF THE INVENTION

1. Field of the Invention

The present invention relates generally to non-volatile semiconductor memory devices. More particularly, this invention relates to flash Electrical Erasable and Programmable Read Only Memories (EEPROMs).

2. Description of the Related Art

Great attention has recently been paid to non-volatile semiconductor memories, such as Ferro-electric Random Access Memories (FRAMs), Erasable and Programmable Read Only Memories (EPROMs) and EEPROMs. As is well known in the art, EPROMs and EEPROMs use floating gates for storing charges that define stored data, and control gates for detecting a change in the threshold voltages based on the presence or absence of charges. In addition, EEPROMs include flash EEPROMs that are capable of performing data erasures for all memory storage areas or a plurality of data erasures for selected block storage areas. In general, there are two types of memory cells in a flash EEPROM: one is a split gate type and the other is a stack gate type. International Patent Publication WO92/18980 discloses a split gate flash EEPROM.

To reduce power consumption in flash EEPROMs, efforts have been made to ensure operation at a lower supply voltage and a multi-value storage operation. The multi-value storage operation generally stores data having three or more values as well as data having two values indicating an erased state and a written state, (i.e., the storage of 1-bit data in one memory cell).

To ensure that data is written accurately, it is important to precisely control the floating gate voltage of each memory cell in the write mode. In other words, it is important to control the voltage applied to the floating gate to a high precision to ensure that the floating gate will have a desired electric potential after a writing operation.

Japanese Unexamined Patent Publication No. 4-57294 discloses a write verification technique for multi-value storage modes to ensure high-precision control of the floating gate voltage. The write verification technique first performs writing to memory cells for a given time (e.g., several hundred nanoseconds to several microseconds), and then performs a verify read operation. Then, the data value to be written is compared with the data value that has been read. When the data values do not match, writing is once again executed for a given time. In this manner, the write operation, the verify read operation and the comparison operation are repeated until both data values coincide.

Unfortunately, when memory cells having different writing characteristics are used, the write operation time may vary. As can be appreciated, this variation in write operation time makes it difficult to accurately control the electric potential of the floating gate after writing to the individual memory cells.

The following is a description of memory cells that have different writing characteristics. The source and drain of a split gate memory cell are defined in the substrate by injecting impurity ions into the substrate using the floating gate and control gate as ion injection masks. Therefore, the position of the drain is defined by the end of the control gate while the position of the source is determined by the end of the floating gate. The control gate and the floating gate are separately formed through deposition of electrode films, a lithographic process and an etching process. The positions of those gates are therefore determined by a mask aligning process using well known lithography machines. Unfortunately, when an error occurs in this mask alignment, the positions of the control gate and the floating gate may be shifted from the intended positions.

When an etching mask RP used for forming control gates CG is shifted from a predetermined position, as shown in FIGS. 1A and 1B, control gates CG having different shapes are formed on the areas where memory cells 101a and 10b are to be formed. As a result of defining drains D on a substrate 102 using the control gates CG having different shapes, channel regions CH will result in different lengths L1 and L2 for the adjoining memory cells 101a and 101b. When the etching mask RP is shifted leftward from the predetermined position, as shown in FIG. 1A, the channel length L2 on the left-hand side becomes longer than the channel length L1 on the right-hand side, as shown in FIG. 1B. On the other hand, when the etching mask RP is shifted rightward from the predetermined position, on the other hand, the right channel length L1 becomes longer than the left channel length L2.

Accordingly, the difference between the channel lengths L1 and L2 leads to a difference in the resistances produced in channels CH. This results in a difference between the cell currents Id that flow in the adjoining memory cells 101a and 101b during write modes. Specifically, a longer channel length L increases the resistance of the channel CH and therefore decreases the cell current Id. Further, the difference in the cell current Id appears as a difference in the generation ratio of hot electrons. Consequently, the writing characteristics of the adjoining memory cells 101a and 101b are different.

FIG. 2 is a graph showing the relationship between the write operation time Tpw and the cell current Id in read mode. The write operation time Tpw is the sum of the write operation times for the cycles of the write operation, the verify read operation and the comparison. It is apparent from this graph that a write operation time Tpw1 for the short channel length L1 is shorter than a write operation time Tpw2 for the long channel length L2. This is because with the same write operation time Tpw, the cell current Id in the short channel length L1 is smaller than that in the long channel length L2. Further, a cell current Id1 in a memory cell that is completely erased is greater than a cell current Id2 in a memory cell that is in a completely written state.

FIG. 3 presents a graph showing the relationship between the channel length L and the time Tpw required to provide a fully written state. This graph shows that as the channel length L becomes longer, the time Tpw increases exponentially.

As apparent from the above, a variation in channel length L originating from the positional deviation of the floating and control gates FG and CG leads to a variation in write operation time Tpw.

One attempt to solve this problem has been to set the write operation time Tpw to a very long time in order to bring the electric potential of the floating gate to a given value after writing to a memory cell. Disadvantageously, this tends to decrease writing speeds and increases the power consumption of the writing operation. In other words, unnecessary writing operations would have to be performed several times on memory cells (i.e., for shorter channel length) that have already been placed in a fully written state in a shorter write operation time Tpw.

SUMMARY OF THE INVENTION

Broadly speaking, the present invention relates to a non-volatile semiconductor memory device that can accurately write data in memory cells regardless of variations in memory cell structures. The present invention can be implemented in numerous ways including as an apparatus and a method.

In one embodiment, a non-volatile semiconductor memory device is disclosed. The semiconductor memory device includes a plurality of memory cells each having a control gate, a source, a drain and a floating gate. A write control unit for controlling voltages applied to the control gates, the sources and the drains to write data in each memory cell. Further, the semiconductor memory device includes a write-current determining circuit. The write-current determining circuit is connected to the write control unit, for determining a write current flowing in the floating gate of each memory cell and controlling the write control unit in accordance with a determination result. In this manner, data is written in each memory cell with a predetermined write current.

In another embodiment, a non-volatile semiconductor memory device is disclosed. The semiconductor memory device includes a plurality of memory cells each having a control gate, a source, a drain and a floating gate. Further included is a write control unit for controlling voltages applied to the control gates, and the sources and the drains to write data in each memory cell. And an electric potential determining circuit being connected to the write control unit for determining an electric potential of the floating gate of each memory cell. The write control unit further controlling the write control unit in accordance with a determination result in such a manner that data is written in each memory cell with a predetermined electric potential.

In yet a further embodiment, the semiconductor memory device includes at least one reference memory cell having a same size as one of the plurality of memory cell, and having a control gate, a source, a drain and a floating gate. The write control unit controls voltages applied to the control gate, source and drain of the reference memory cell in a same manner as done for those of the memory cells. And, the electric potential determining circuit determines an electric potential of the floating gate of the reference memory cell and controls the write control unit in accordance with the determination result of the reference memory cell in such a manner that data is written in each memory cell with the predetermined electric potential.

In still a further embodiment, a non-volatile semiconductor memory device is disclosed. The memory device includes a plurality of memory cells each having a control gate, a source, a drain and a floating gate. Further included is a write control unit for controlling voltages applied to the control gates, the sources and the drains to write data in each memory cell. In addition, a cell current determining circuit connected to the write control unit is included for determining a cell current flowing in each memory cell and controlling the write control unit in accordance with a determination result in such a manner that data is written in each memory cell with a predetermined cell current.

Other aspects and advantages of the invention will become apparent from the following description, taken in conjunction with the accompanying drawings, illustrating by way of example the principals of the invention.

BRIEF DESCRIPTION OF THE DRAWINGS

The invention, together with objects and advantages thereof, may best be understood by reference to the following description of the presently preferred embodiments together with the accompanying drawings in which:

FIG. 5 is a cross-sectional view schematically illustrating two adjoining split gate memory cells with a source located in between;

FIG. 7 is a diagram showing voltages applied to selected word lines, a selected bit lines, a common source line and a substrate in the individual operation modes of the conventional flash EEPROM;

FIG. 10 is a diagram showing voltages applied to selected word lines, a selected bit lines, a common source line and a substrate in the individual operation modes of the another conventional flash EEPROM;

DETAILED DESCRIPTION OF THE PREFERRED EMBODIMENTS

Figure 4:
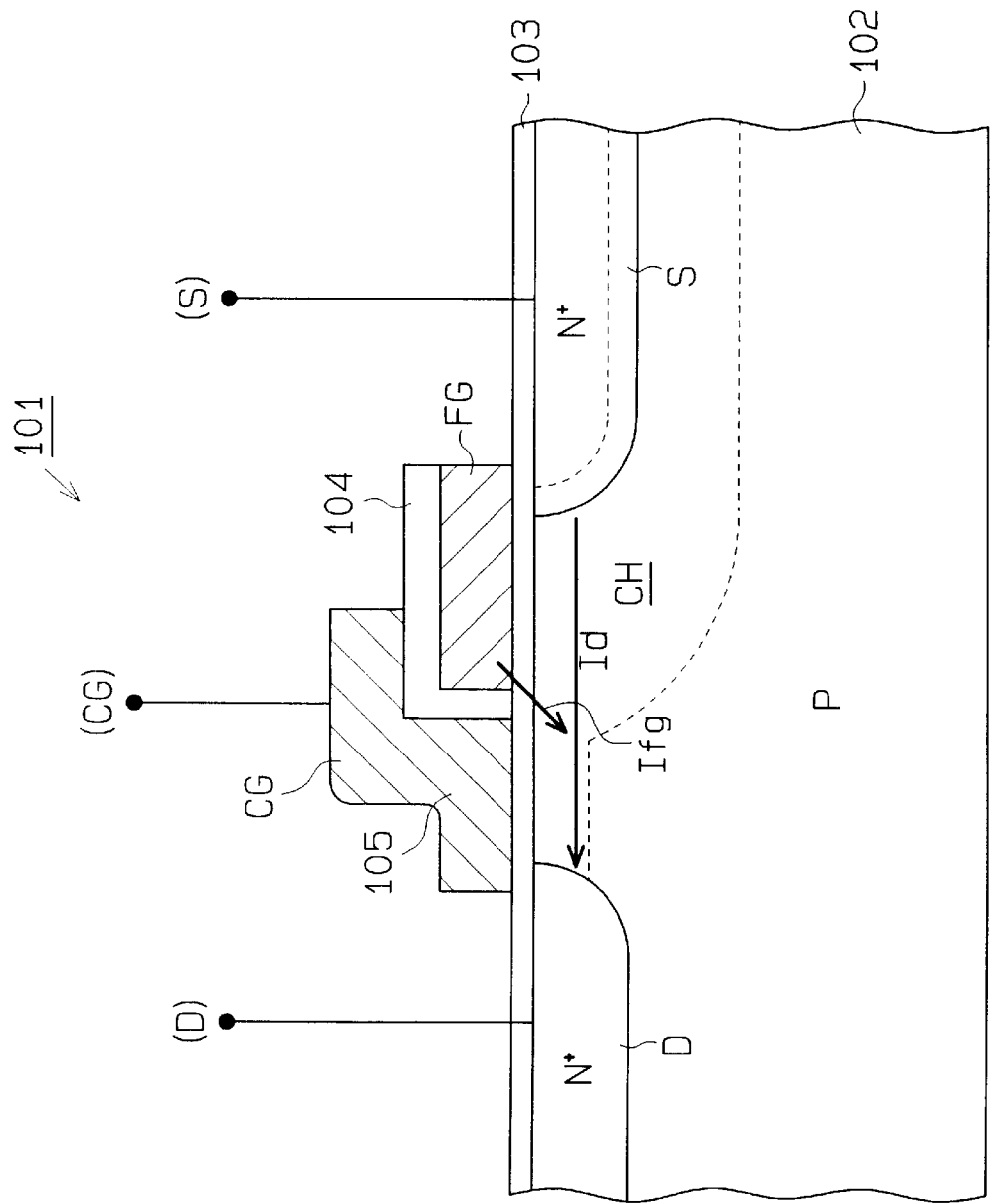
FIG. 4 is a cross-sectional view schematically illustrating a conventional split gate memory cell.

A non-volatile semiconductor memory device according to one embodiment of the present invention will now be described with reference to the accompanying drawings. FIG. 4 is a cross-sectional view schematically illustrating a conventional split gate memory cell 101 disclosed in International Patent Publication WO92/18980. The split gate memory cell 101 has a source S of an N type conductivity and a drain D of the N type conductivity, both defined on a single crystalline silicon substrate 102 having a P type conductivity. Also shown is a floating gate FG provided on a channel CH between the source S and drain D over a first insulator film 103, and a control gate CG provided on the floating gate FG over a second insulator film 104. A part of the control gate CG is arranged as a select gate 105 on the channel CH over the first insulator film 103, and the remaining part of the control gate CG is arranged on the floating gate FG over the second insulator film 104.

Figure 5:
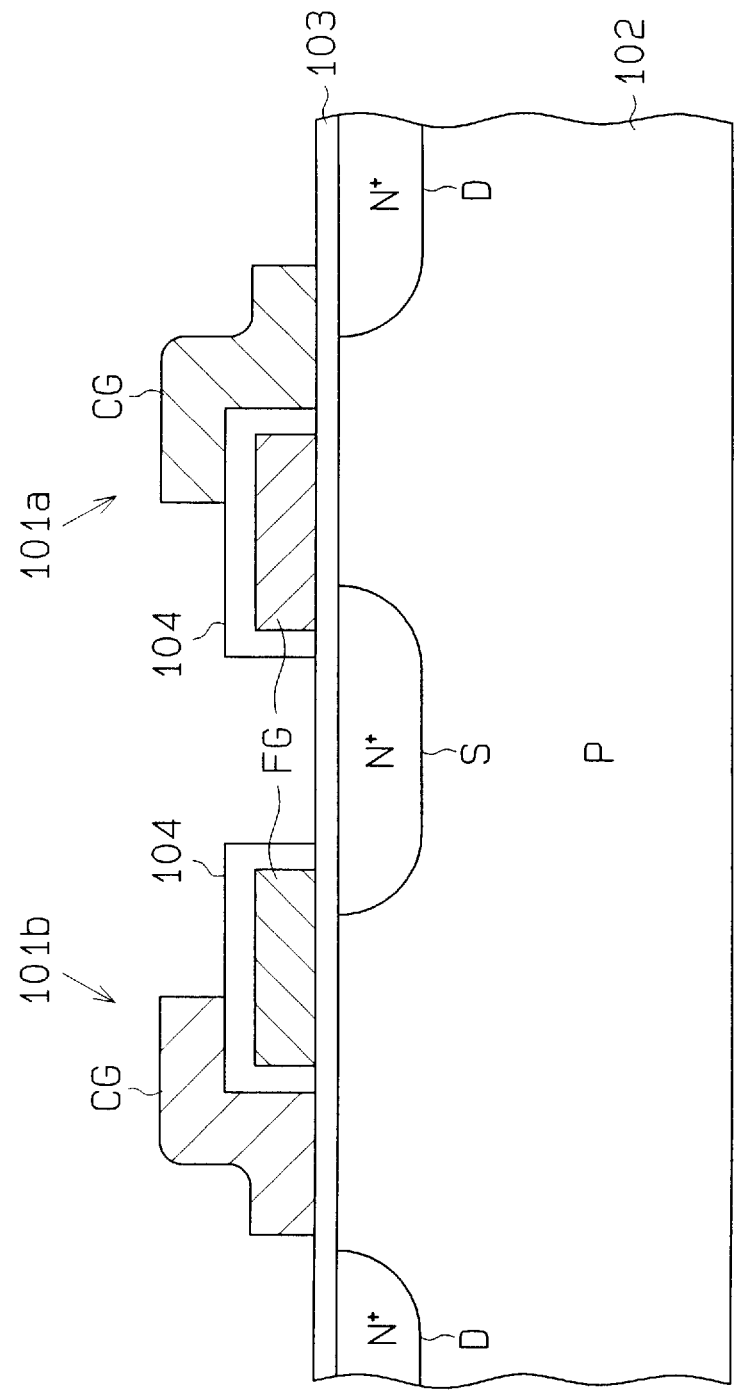

FIG. 5 is a cross-sectional view schematically illustrating two adjoining split gate memory cells 101a and 101b with a source S located in between. To suppress the area of the memory cells occupying on the substrate 102, the adjoining memory cells 101a and 101b share the source S and have the floating gates FG and control gates CG arranged symmetrically with the source S as the center.

Figure 6:
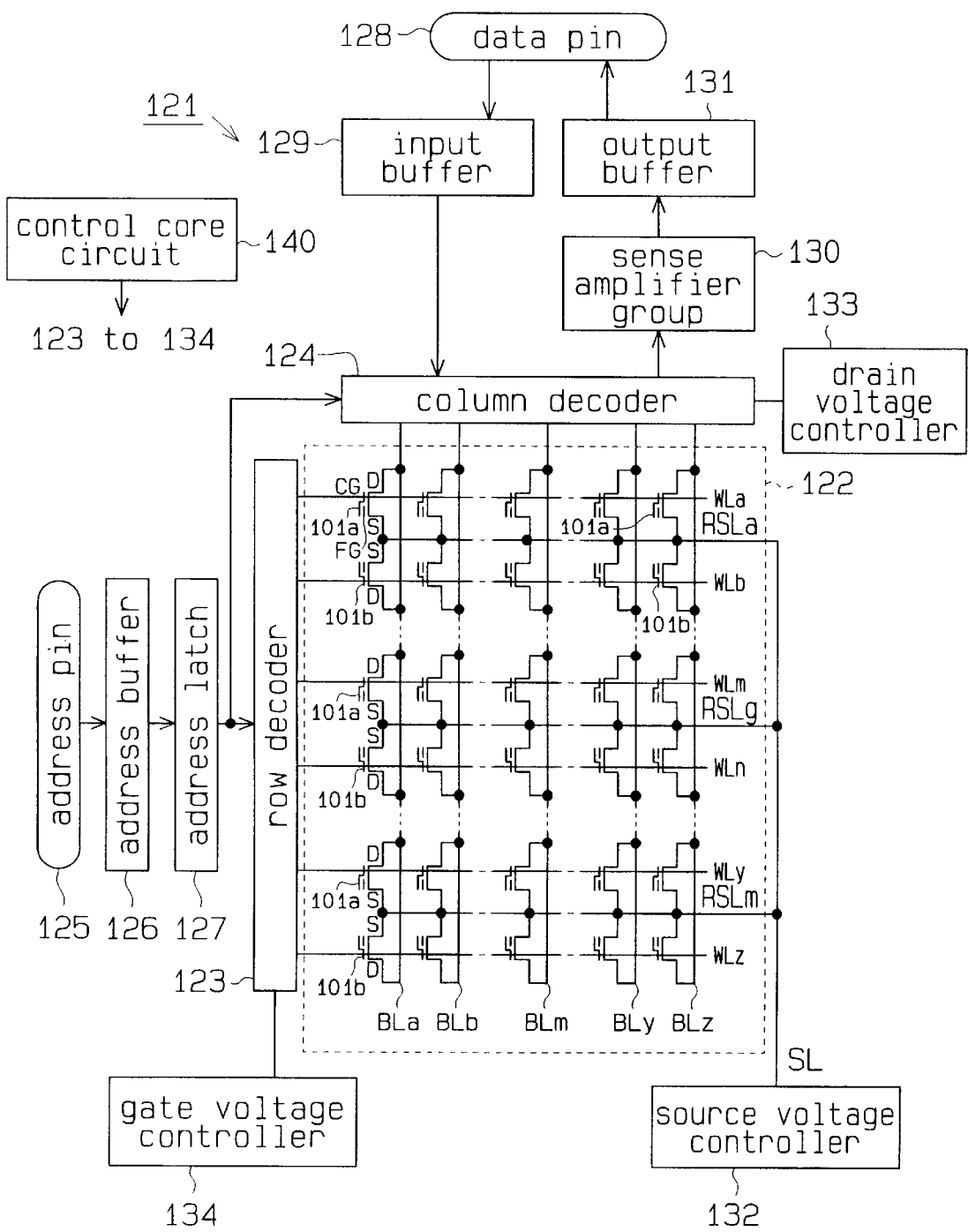
FIG. 6 is a block diagram of a conventional flash EEPROM.

FIG. 6 is a block diagram showing a conventional flash EEPROM 121 having a plurality of split gate memory cells 101. The flash EEPROM 121 includes a memory cell array 122, a row decoder 123, a column decoder 124, an address pin 125, an address buffer 126, an address latch 127, a data pin 128, an input buffer 129, a sense amplifier group 130, an output buffer 131, a source voltage controller 132, a drain voltage controller 133, a gate voltage controller 134 and a control core circuit 140.

The memory cell array 122 has a matrix of split gate memory cells 101, a plurality of word lines WLa to WLz each commonly connected to the control gates CG of an associated row of memory cells 101, a plurality of bit lines BLa to BLz each commonly connected to the drains D of an associated column of memory cells 101, and source lines RSLa to RSLm each connected to the common source S of each odd row of memory cells 101a and each even row of memory cells 101b. The individual source lines RSLa-RSLm are connected to a common source line SL. The word lines WLa-WLz are connected to the row decoder 123, and the bit lines BLa-BLz are connected to the column decoder 124. The common source line SL is connected to the source voltage controller 132.

The address pin 125 receives a row address and a column address supplied from an external unit (not shown) and then supplies those addresses to the address buffer 126. The address buffer 126 transfers the row address and column address to the address latch 127. The address latch 127 latches those addresses and transfers the row address to the row decoder 123 and the column address to the column decoder 124. The row decoder 123 selects one word line in accordance with the row address, and connects the selected word line to the gate voltage controller 134. The column decoder 124 selects one bit line in accordance with the column address, and connects the selected bit line to the drain voltage controller 133.

The gate voltage controller 134 controls the voltage applied to the selected word line WLm in accordance with the individual operation modes shown in FIG. 7. The drain voltage controller 133 controls the voltage applied to the selected bit line in accordance with the individual operation modes. The source voltage controller controls the voltage applied to the individual source lines RSLa-RSLm via the common source line SL in accordance with the individual operation modes.

The data pin 128 receives data supplied from the external unit (not shown) and supplies the data to the input buffer 129. The input buffer 129 transfers the data to the column decoder 124. The column decoder 124 controls the voltage applied to any selected one of the bit lines BLa-BLz according to that data.

Data read from an arbitrary memory cell 101 is transferred from the selected bit line to the sense amplifier group 130 via the column decoder 124. The sense amplifier group 130 includes a plurality of sense amplifiers (not shown). The column decoder 124 operates in such a manner as to connect the selected bit line to the sense amplifiers. The sense amplifier group 130 discriminates the data and supplies it to an output buffer 131. The output buffer 131 supplies the data to the data pin 128. The read data is then supplied from the data pin 128 to an external unit. The control core circuit 140 controls the operations of the row decoder 123, the column decoder 124, the address pin 125, the address buffer 126, the address latch 127, the data pin 128, the input buffer 129, the sense amplifier group 130, the output buffer 131, the source voltage controller 132, the drain voltage controller 133 and the gate voltage controller 134.

The individual operation modes (erase mode, write mode and read mode) of the flash EEPROM 121 will now be discussed with reference to FIG. 7.

(a) Erase Mode

In erase mode, a voltage of the ground level (=0 V) is applied to all the source lines RSLa-RSLm and all the bit lines BLa-BLz. A voltage of +14 to 15 V is applied to a selected word line WLm and a voltage of the ground level is applied to the other, non-selected word lines WLa-WLl and WLn-WLz. Therefore, data is erased from all the memory cells 101a that are connected to the selected word line WLm as the electric potentials of the control gates CG of those memory cells 101a are pulled up to +14 to 15 V.

When the electric potential of the control gate CG is +14 to 15 V and the electric potential of the drain is 0 V, a high electric field is produced between the control gate CG and the floating gate FG so that a Fowler-Nordheim (FN) tunnel current flows between those gates. Consequently, electrons in the floating gate FG are pulled out to the control gate CG, resulting in data erasure. This erasing operation is based on the fact that the electrostatic capacitance between the source S and the substrate 102 and the floating gate FG is significantly greater than that between the control gate CG and the floating gate FG. Simultaneous selection of a plurality of word lines WLa-WLz allows for data erasure of all the memory cells 101 that are connected to the selected individual word lines. This erasure is called "block erasure".

(b) Write Mode

In write mode, a voltage of the ground level is applied to a selected bit lines BLm and a voltage (in this case +2 V) equal or grater than voltage applied to the other, non-selected bit lines BLa-BLl and BLn-BLz. A voltage of +2 V is applied to a word line WLm connected to a control gate CG of a selected memory cell 101 and a voltage of the ground level is applied to the other, non-selected word lines WLa-WLl and WLn-WLz. A voltage of +12 V is applied to the common source line SL. Consequently, the electric potential of the floating gate FG is pulled up by the capacitive coupling between the source S and the floating gate FG, thus producing a high electric field between the control gate CG and the floating gate FG. Thus, the electrons in the channel CH are accelerated to become hot electrons which are supplied to the floating gate FG, allowing a write current Ifg (see FIG. 4) to flow to the substrate 102 from the floating gate FG. As a result, charges are stored in the floating gate FG of the selected memory cell 101 and 1-bit data is written.

It is noted that each memory cell has a threshold voltage Vth of +0.5 V and includes a transistor, which includes a control gate CG, source S and drain D. Therefore, electrons in the drain D are moved in the channel CH in the inverted state, so that the cell current Id (see FIG. 4) flows to the drain D from the source S.

(c) Read Mode

In read mode, a voltage of +4 V is applied to a selected word line WLm and the voltage of the ground level is applied to the other, non-selected word lines WLa-WLl and WLn-WLz. A voltage of +2 V is applied to a selected bit line BLm and the voltage of the ground level is applied to the other, non-selected bit lines BLa-BLl and BLn-BLz. As a result, the cell current Id which flows to the source S of the memory cell 101 in the erased state from the drain D becomes greater than the cell current flowing in the memory cell 101 in the written state. This is because the channel CH directly below the floating gate FG of the data-erased memory cell is enabled, while the channel CH directly below the floating gate FG of the data-written memory cell is disabled in the memory cell 101 in the written state.

More specifically, because electrons are drained from the floating gate FG of a data-erased memory cell, the floating gate FG is positively charged. Therefore, the channel CH directly below the positively-charged floating gate FG is enabled. As electrons are supplied into the floating gate FG of a data-written memory cell, the floating gate FG is negatively charged. The channel CH directly below the negatively-charged floating gate FG is thus disabled. Each sense amplifier in the sense amplifier group 130 discriminates the level of the cell current flowing in the associated memory cell as erase data "1" or write data "0". In this manner, binary data having a data value "1" indicating the erased state and a data value "0" indicating the written state may be stored in each memory cell.

Figure 8:
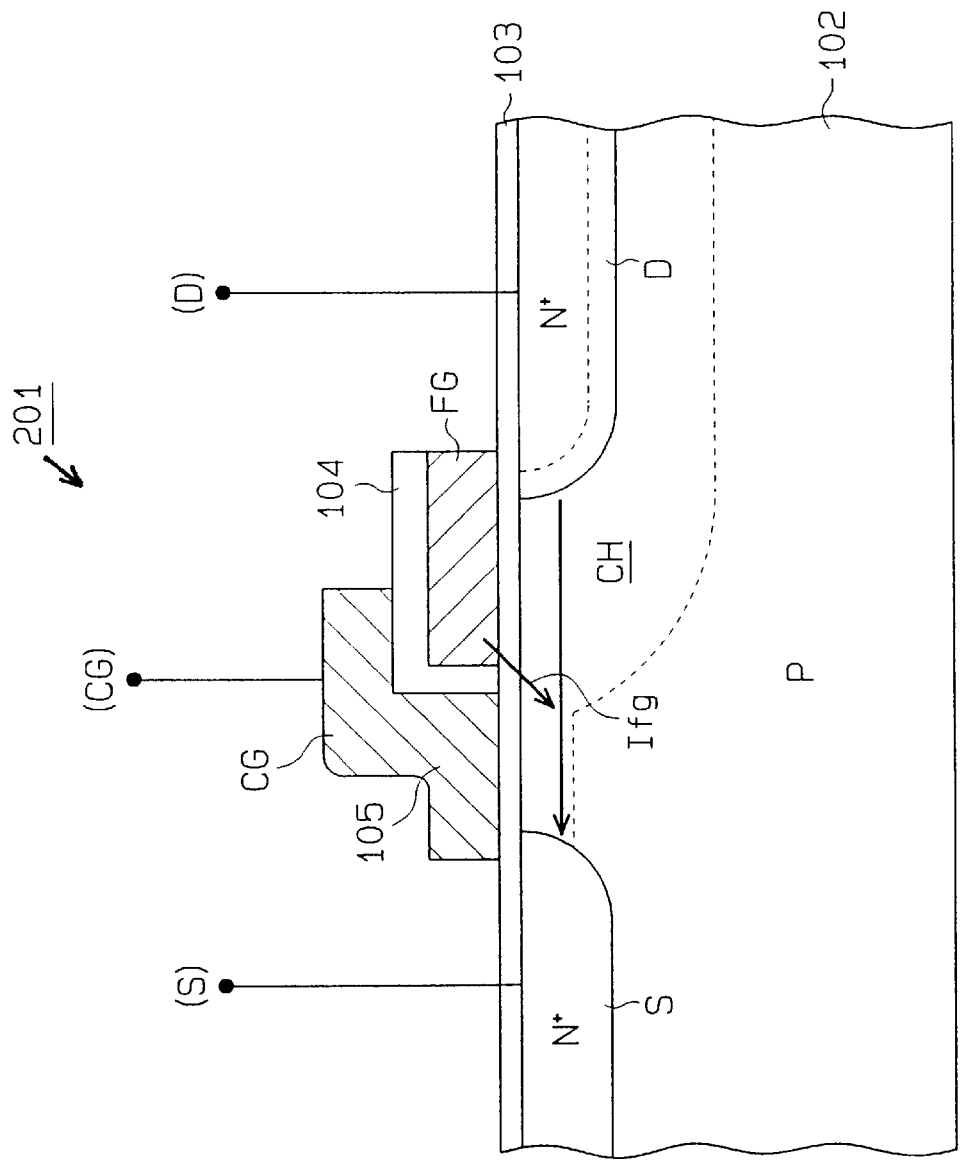
FIG. 8 is a cross-sectional view schematically showing another conventional split gate memory cell.
Figure 9:
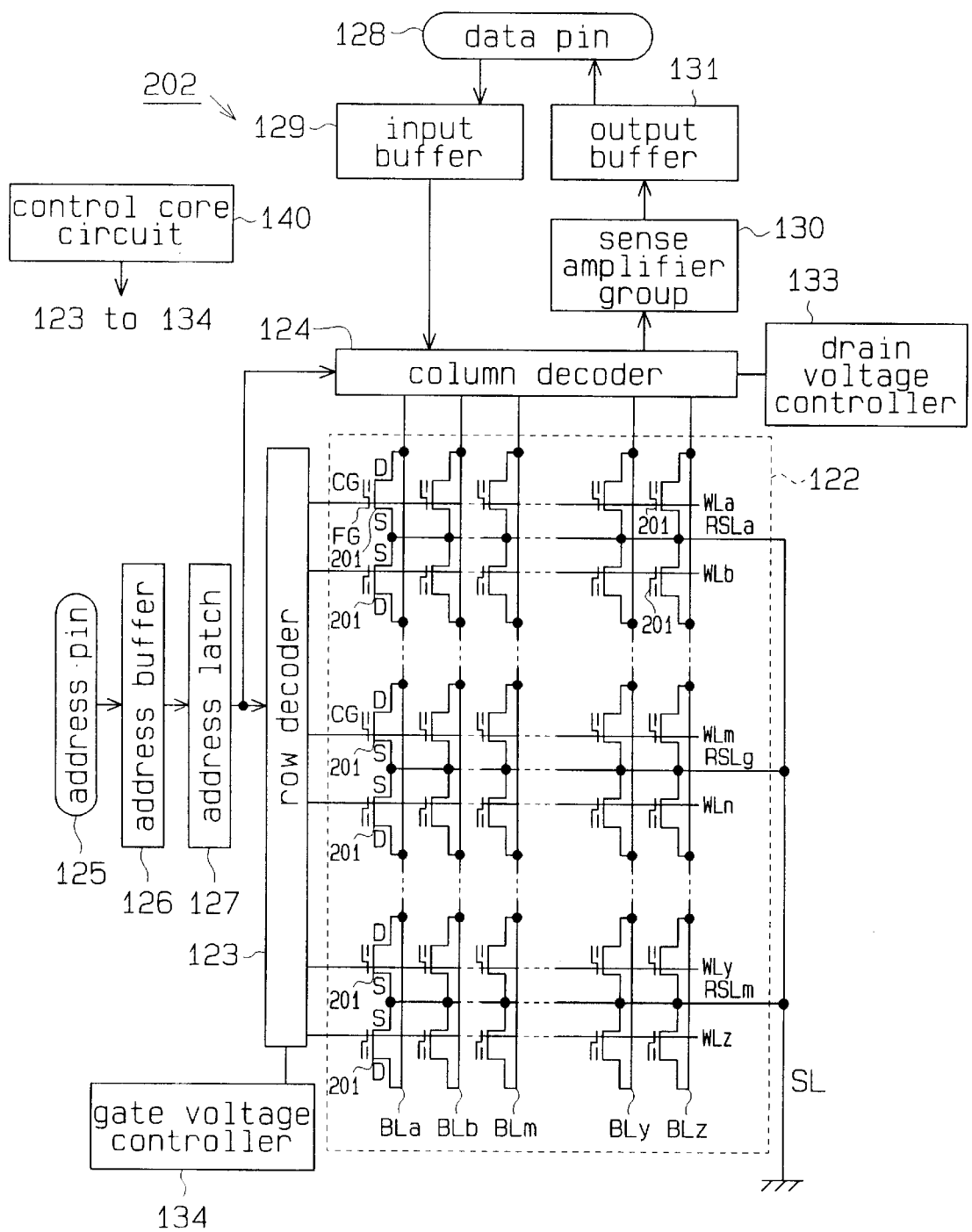
FIG. 9 is a block diagram illustrating another conventional flash EEPROM.

U.S. Pat. No. 5,029,130 discloses a flash EEPROM in which the source S of the split gate memory cell 101 is identified as a "drain" and the drain D is identified as a "source". FIG. 8 is a cross-sectional view schematically illustrating a split gate memory cell 201, disclosed in U.S. Pat. No. 5,029,130. FIG. 9 is a block diagram showing a flash EEPROM 202 having split gate memory cells 201. FIG. 10 shows voltages applied to a selected word line, a selected bit line, the common source line and the substrate in the individual operation modes of the flash EEPROM 202. The flash EEPROM 202 differs from the flash EEPROM 121 in that the common source line SL is grounded. In any operation mode, the voltage of the ground level is applied to the individual source lines RSLa-RSLm via the common source line SL.

In write mode, +12 V is applied to a selected bit line BLm while the voltage of the ground level is applied to the non-selected bit lines BLa-BLl and BLn-BLz. As a result, a high electric field is generated between the control gate CG and the floating gate FG. This allows hot electrons to be supplied to the floating gate FG, so that the write current Ifg flows to the substrate 102 from the floating gate FG. Consequently, 1-bit data may be written and stored in the selected memory cell 201. In memory cell 201, the cell current flows toward the source S from the drain D.

The source voltage controller 132 in the flash EEPROM 121 may be replaced with a source current controller which controls the cell current value Id to a given value. In this case, the voltages applied to the source lines RSLa-RSLm are controlled in accordance with the individual operation modes as shown in FIG. 7. The drain voltage controller 133 in the flash EEPROM 121 or the flash EEPROM 202 may be replaced with a drain current controller which controls the cell current value Id to a given value. In this case, the voltage applied to a single bit line is controlled in accordance with each operation mode as shown in FIG. 7 or FIG. 10. The flash EEPROM 121 may be provided with a source line decoder, which selects one source line in accordance with the column address and connects the selected source line to the source voltage controller 132.

Figure 11:
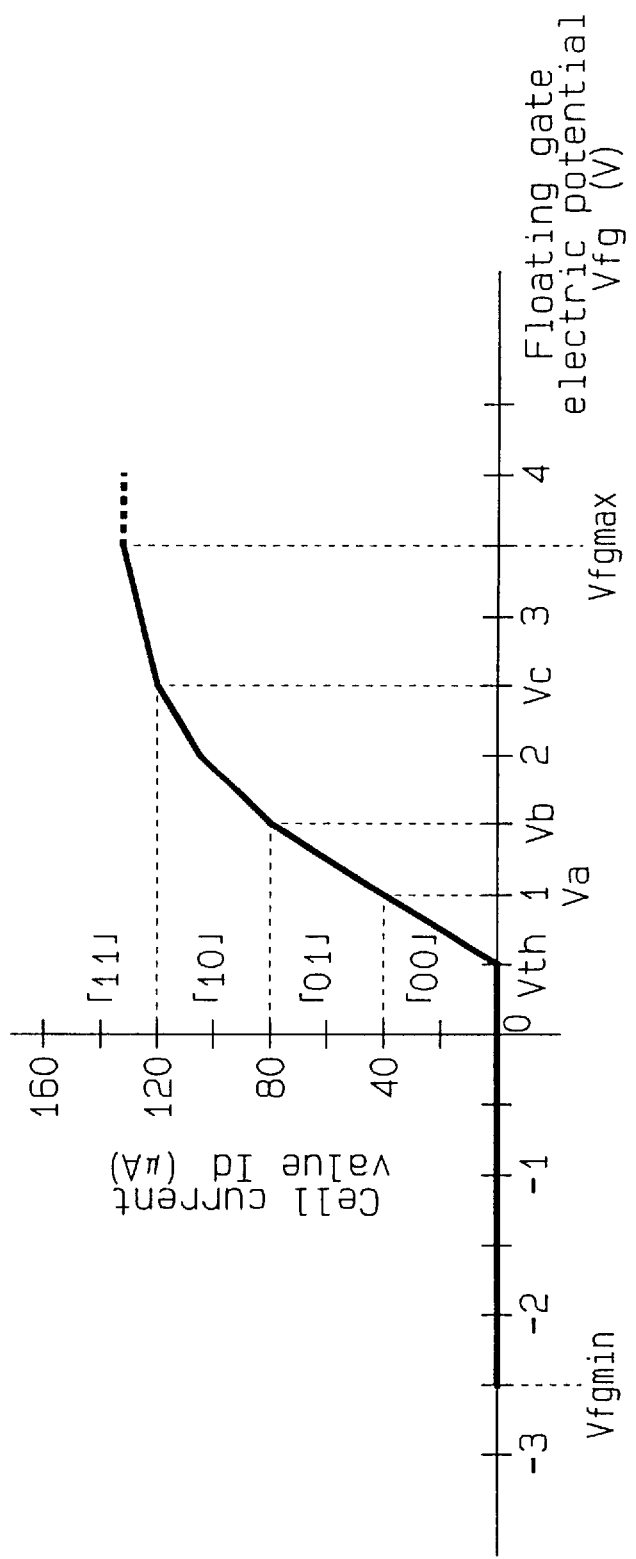
FIG. 11 is a characteristic graph illustrating the relationship between the electric potential of a floating gate of the conventional split gate memory cell and the memory cell current value.

In the flash EEPROMs 121 and 202, multi-value data can be stored in any memory cell 101 and 201 by adjusting the value of the cell current Id which flows in that memory cell 101 and 201. FIG. 11 presents a characteristic graph illustrating the relationship between the electric potential, Vfg, of the floating gate of the split gate memory cell 101 and 201 and the cell current value Id. This electric potential Vfg of the floating gate FG (hereinafter referred to as "floating gate potential") is the electric potential of the floating gate FG with respect to the electric potential of the drain D of the memory cell 101 (source S of the memory cell 201), and is given by the following equation:

$$Vfg = Vfgw + Vfgc$$

where Vfgw is the electric potential that is produced by charges stored in the floating gate FG in write mode and Vfgc is the potential produced by the capacitive coupling with the source S of the memory cell 101 (drain D of the memory cell 201). In read mode, the electric potential Vfgc is constant so that the cell current value Id is specifically determined by the electric potential Vfgw. In write mode, the amount of charges in the floating gate FG or the electric potential Vfgw can be controlled by adjusting the write operation time. The control on the floating gate potential Vfg permits the cell current value Id in read mode to be set in an arbitrary value.

Suppose that a data value "00" is associated with the area of the cell current value Id which is less than 40 mA, a data value "01" is associated with the area of the cell current value Id which is equal to or greater than 40 mA and less than 80 mA, a data value "10" is associated with the area of the cell current value Id which is equal to or greater than 80 mA and less than 120 mA, and a data value "11" is associated with the area of the cell current value Id which is equal to or greater than 120 mA. In this case, the write operation time is controlled in such a way that individual floating gate potentials Va, Vb and Vc corresponding to the individual cell current values Id (40 mA, 80 mA and 120 mA) in write mode.

When the floating gate potential vfg is equal to or greater than Vc (Vc=about +2.5 V), the data value "11" is stored in a data-erase memory cell from whose floating gate FG electrons are drawn out. In writing data in that data-erased memory cell, as charges are being stored in the floating gate FG, the floating gate potential Vfg drops.

When the writing operation is stopped at the time the floating gate potential Vfg becomes equal to or greater than Vb (=+1.5 V) and less than Vc (=+2.5 V), the data value "10" is written in the memory cell. When the writing operation is stopped at the time the floating gate potential Vfg becomes equal to or greater than Va (=+1.0 V) and less than Vb, the data value "01" is written in the memory cell. When the writing operation is stopped at the time the floating gate potential Vfg becomes less than Va, the data value "00" is written in the memory cell. In this manner, four-value (2-bit) data can be stored in a single memory cell.

In read mode, when the floating gate potential Vfg is smaller than the threshold voltage Vth (=+0.5 V) of the transistor which has the floating gate FG, the source S and the drain D, the cell current value Id is 0. When the floating gate potential Vfg exceeds the threshold voltage Vth, the cell current value Id increases upper rightward in FIG. 11. When the floating gate potential Vfg exceeds +3.5 V, the cell current value Id is saturated due to the constant resistance of the channel CH which lies directly below the control gate CG. That is, the channel CH serves as a constant resistor because a constant voltage (=+4 V) is applied to the control gate CG. Therefore, a series connection of the transistor to the constant resistor of the channel CH is present in the memory cell. When the floating gate potential Vfg is less than a given value (=+3.5 V), as apparent from the above, the cell current value Id varies in accordance with the characteristic of the transistor.

A split gate flash EEPROM according to a first embodiment of this invention will now be described with reference to the accompanying drawings. To avoid the redundant description, like or same reference numerals are given to those components which are the same as the corresponding components of the prior art.

Figure 12:
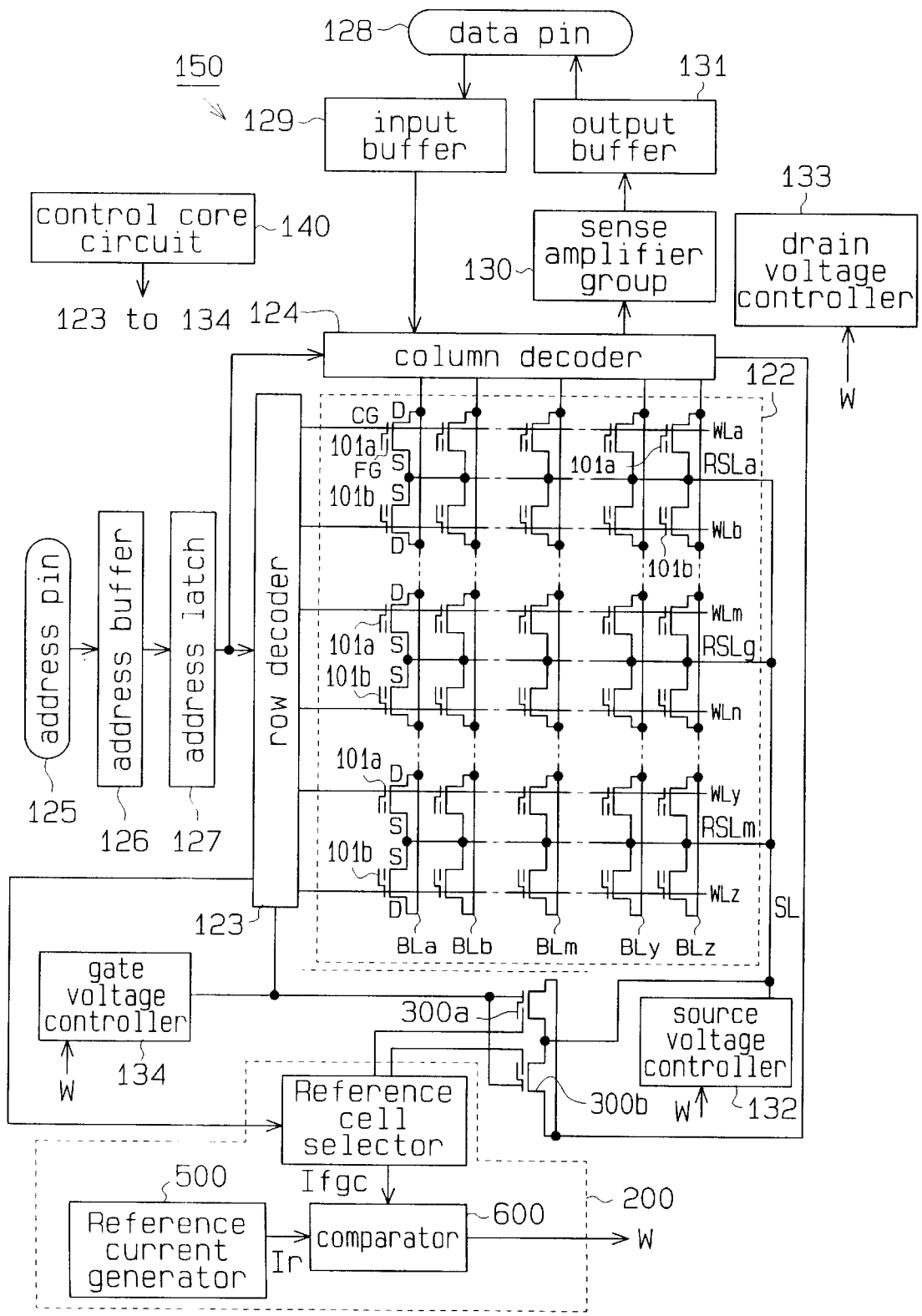
FIG. 12 is a block diagram of a flash EEPROM according to the first embodiment of the invention.

As shown in FIG. 12, a flash EEPROM 150 according to the first embodiment comprises a write-current determining circuit 200 and reference cells 300a and 300b in addition to a structure including the memory cell array 122, the row decoder 123, the column decoder 124, the address pin 125, the address buffer 126, the address latch 127, the data pin 128, the input buffer 129, the sense amplifier group 130, the output buffer 131, the source voltage controller 132, the drain voltage controller 133, the gate voltage controller 134 and the control core circuit 140. The write-current determining circuit 200 includes a reference cell selector 400, a reference current generator 500 and a comparator 600.

Figure 1A:
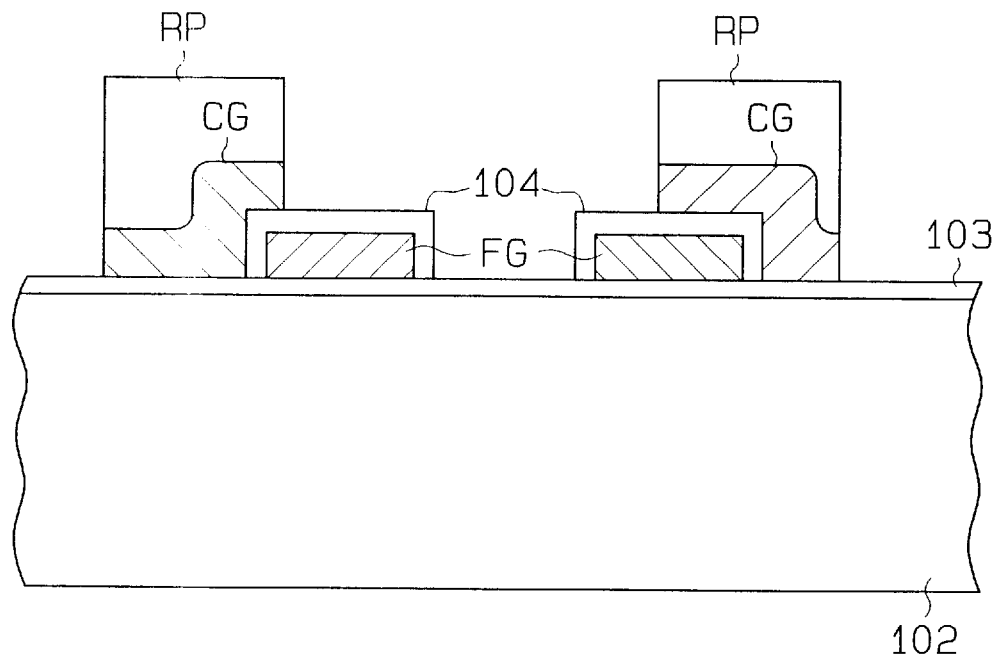
FIG. 1A is a cross-sectional view schematically depicting the formation of control gates with different shapes on a semiconductor substrate.
Figure 1B:
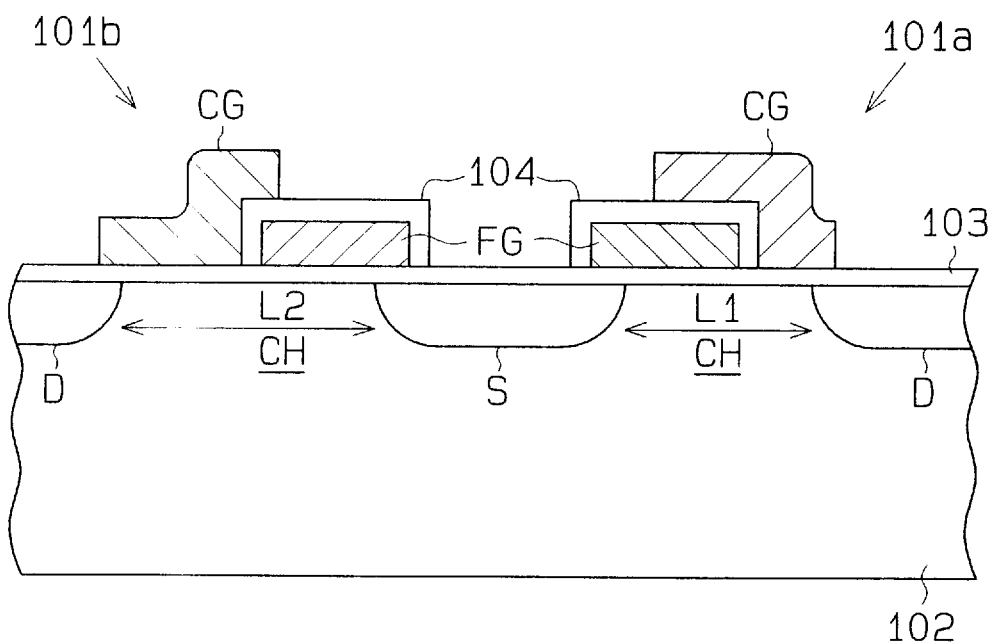
FIG. 1B is a cross-sectional view schematically depicting a pair of memory cells having control gates with different shapes.
Figure 2:
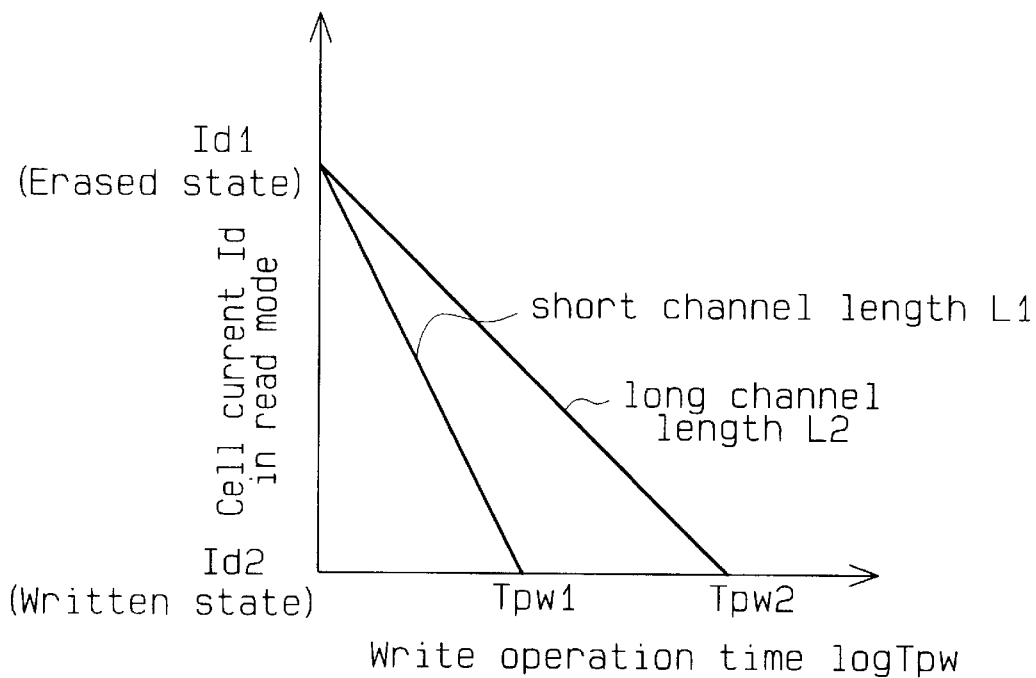
FIG. 2 is a graph showing the relationship between the write operation time and the cell current in a read mode according to prior art.
Figure 3:
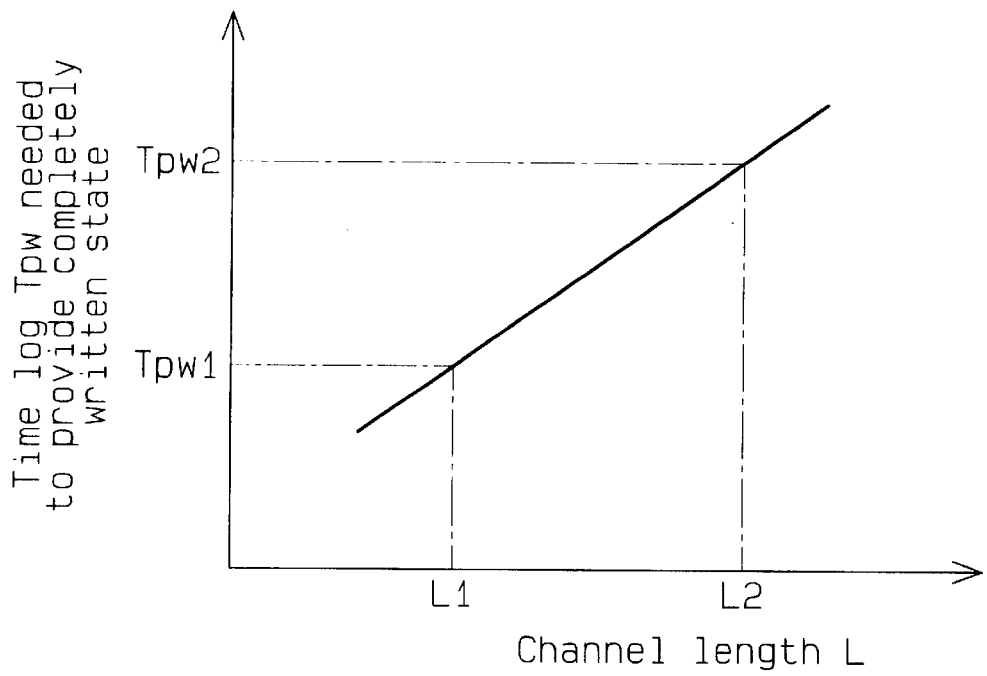
FIG. 3 is a graph showing the relationship between the channel length and the time needed to provide a fully written state in the prior art.
Figure 13:
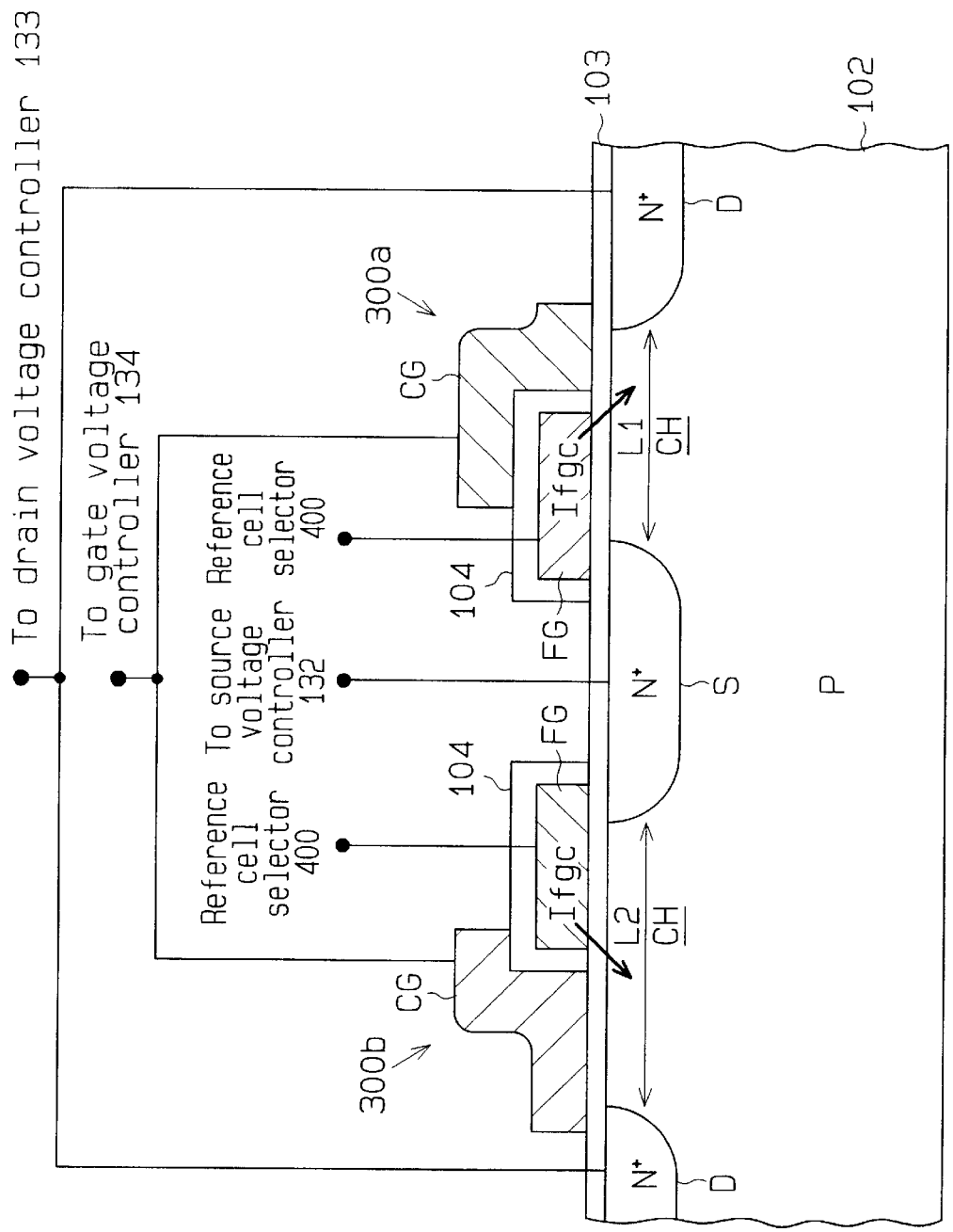
FIG. 13 is a cross-sectional view schematically depicting two reference cells.

FIG. 13 is a cross-sectional view schematically depicting the reference cells 300a and 300b. Like or same reference numerals are given to those components of the reference cells 300a and 300b which are the same as the corresponding components of the memory cell 101. The reference cells 300a and 300b are formed in the vicinity of the memory cell array 122 during the same process steps used in forming the memory cells 101a and 101b (see FIG. 5). Further, the reference cells 300a and 300b have the same dimensions as the memory cells 101a and 101b. The reference cells 300a and 300b share the source S and have the floating gates FG and control gates CG arranged symmetrically with respect to the source S as the center. The reference cells 300a and 300b respectively have the same channel lengths L1 and L2 as those of the memory cells 101a and 101b. When the channel length L2 of the memory cell 101b is longer than the channel length L1 of the memory cell 101a as shown in FIG. 1B, for example, the channel length L2 of the reference cell 300b becomes longer than the channel length L1 of the reference cell 300a.

The reference cells 300a and 300b have the sources S connected to the source voltage controller 132, the drains D connected to the drain voltage controller 133 and the control gates CG connected to the gate voltage controller 134. Accordingly, the same voltages as applied to the source S, the drain D and the control gate CG of the memory cell that is selected by the decoders 123 and 124 are applied to the source S, the drain D and the control gate CG of each reference cell 300a or 300b in accordance with each operation mode (erase mode, write mode or read mode). That is, the bias condition for the reference cells 300a and 300b are the same as those for the selected memory cell. Further, the floating gates FG of the reference cells 300a and 300b are connected to the reference cell selector 400.

The reference cell selector 400 selects either the reference cell 300a or 300b based on the word line selected by the row decoder 123, and operates to connect the floating gate FG of the selected reference cell to the comparator 600. When an odd word line WLa, WLm, WLy or the like is selected or when the memory cell 101a is selected, for example, the reference cell 300a is selected. When an even word line WLb, WLn, WLz or the like is selected or when the memory cell 101b is selected, the reference cell 300b is selected.

The reference current generator 500 generates a reference current Ir. The value of the reference current Ir is set to the same value of the write current Ifc which flows to the substrate 102 from the floating gate FG of the reference cell 300a or 300b when the channel lengths L1 and L2 of each reference cell 300a or 300b are the same. In other words, the value of the reference current Ir is the mean value of the two write currents Ifgc of the reference cells 300a and 300b. The reference current generator 500 can employ a method of generating a predetermined reference current Ir or a method of acquiring the average value of the two write currents Ifgc of the reference cells 300a and 300b every time the write operation is carried out.

The comparator 600 compares the write current Ifgc of the selected reference cell with the reference current Ir, and generates a control signal W in accordance with the comparison result. In write mode, the voltage controllers 132 to 134 are controlled by the control signal W from the comparator 600. When write current Ifgc is smaller than the reference current Ir, the comparator 600 controls the individual voltage controllers 132–134 by one of the following schemes (1) to (4) in such a manner that the write current Ifgc increases to become substantially the same as the reference current Ir.

(1) The individual voltage controllers 132–134 are controlled such that the source voltage controller 132 outputs a voltage which rises from +12 V (see FIG. 7), and the other voltage controllers 133 and 134 output predetermined voltages. Consequently, only the electric potentials of the sources S of the memory cell and the selected reference cell rises.

(2) The individual voltage controllers 132–134 are controlled in such a way that the gate voltage controller 134 outputs a voltage that rises from +2 V, and the other voltage controllers 132 and 133 output predetermined voltages. Consequently, only the electric potentials of the control gates CG of the selected memory cell and reference cell rise.

(3) The individual voltage controllers 132–134 are controlled in such a way that the source voltage controller 132 outputs a voltage which rises from +12 V, the gate voltage controller 134 outputs a voltage greater than +2 V and the drain voltage controller 133 outputs a predetermined voltage. Consequently, only the electric potentials of the sources S and the control gates CG of the selected memory cell and reference cell rise.

(4) The individual voltage controllers 132–134 are controlled in such a way that the drain voltage controller 133 outputs a voltage which drops from 0 V, and the other voltage controllers 132 and 134 output predetermined voltages. Consequently, only the electric potentials of the drains D of the selected memory cell and reference cell fall.

When write current Ifgc is greater than the reference current Ir, the comparator 600 controls the individual voltage controllers 132–134 by one of the following schemes (5) to (8) in such a manner that the write current Ifgc decreases to become substantially the same as the reference current Ir.

(5) The individual voltage controllers 132–134 are controlled such that the source voltage controller 132 outputs a voltage which drops from +12 V, and the other voltage controllers 133 and 134 output predetermined voltages. Consequently, only the electric potentials of the sources S of the memory cell and the reference cell which have been selected fall.

(6) The individual voltage controllers 132–134 are controlled in such a way that the gate voltage controller 134 outputs a voltage which drops from +2 V, and the other voltage controllers 132 and 133 output predetermined voltages. Consequently, only the electric potentials of the control gates CG of the selected memory cell and reference cell rise.

(7) The individual voltage controllers 132–134 are controlled in such a way that the source voltage controller 132 outputs a voltage which falls from +12 V, the gate voltage controller 134 outputs a voltage which falls from +2 V and the drain voltage controller 133 outputs a predetermined voltage. Consequently, only the electric potentials of the sources S and the control gates CG of the selected memory cell and reference cell fall.

(8) The individual voltage controllers 132–134 are controlled in such a way that the drain voltage controller 133 outputs a voltage which rises from 0 V, and the other voltage controllers 132 and 134 output predetermined voltages. Consequently, only the electric potentials of the drains D of the selected memory cell and reference cell rise.

As apparent from (1) to (8) above, the output voltages of the individual voltage controllers 132–134 are controlled so that the write current Ifgc and the reference current Ir become substantially equal to each other. In other words, the bias condition for the reference cells 300a and 300b in write mode is controlled in such a way that the write current Ifgc and the reference current Ir become substantially equal. Even when the channel lengths L1 and L2 of the reference cells 300a and 300b differ from each other, therefore, the desired write current Ifgc which is substantially the same as the reference current Ir can be acquired.

The bias conditions for the selected reference cell and memory cell are substantially the same. It is therefore possible to control the bias condition for the selected memory cell in such a fashion that the write current Ifgc and the reference current Ir become substantially equal. Even if the channel lengths L1 and L2 of the memory cells 101a and 101b differ from each other, therefore, the desired write current Ifgc which is substantially the same as the reference current Ir can be acquired. Of course, the present invention is not limited to the details of the first embodiment that controls the write current Ifg, but may also be adapted to a flash EEPROM which can accurately control the written statuses of the memory cells, regardless of a structural variation in the memory cells, by controlling the floating gate potential Vfg or the cell current Id in write mode.

Figure 14:
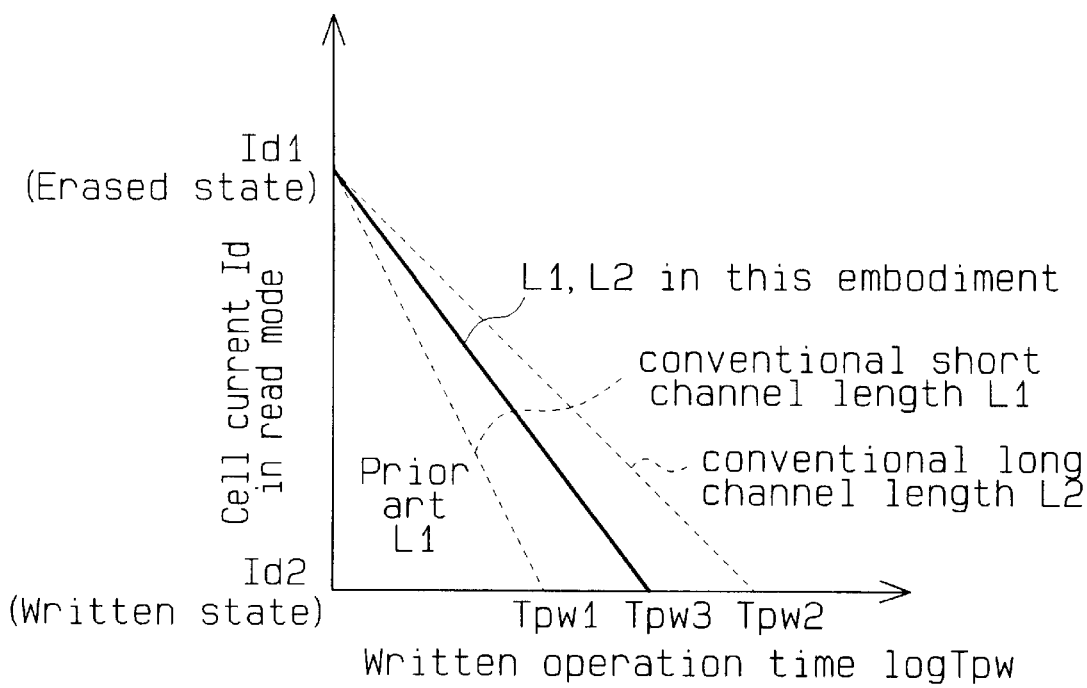
FIG. 14 is a graph showing the relationship between the write operation time and the memory cell current in a read mode according to the first embodiment.

FIG. 14 is a characteristic graph showing the relationship between the write operation time Tpw and the cell current Id in read mode according to the first embodiment. The first embodiment is indicated by the solid line, and the prior art by the broken line. With the same write operation time Tpw, the cell currents Id in the short channel length L1 and the long channel length L2 are substantially the same in the first embodiment. Further, the times Tpw needed to provide the completely written state for the short channel length L1 and the long channel length L2 are substantially the same (Tpw3).

Figure 15:
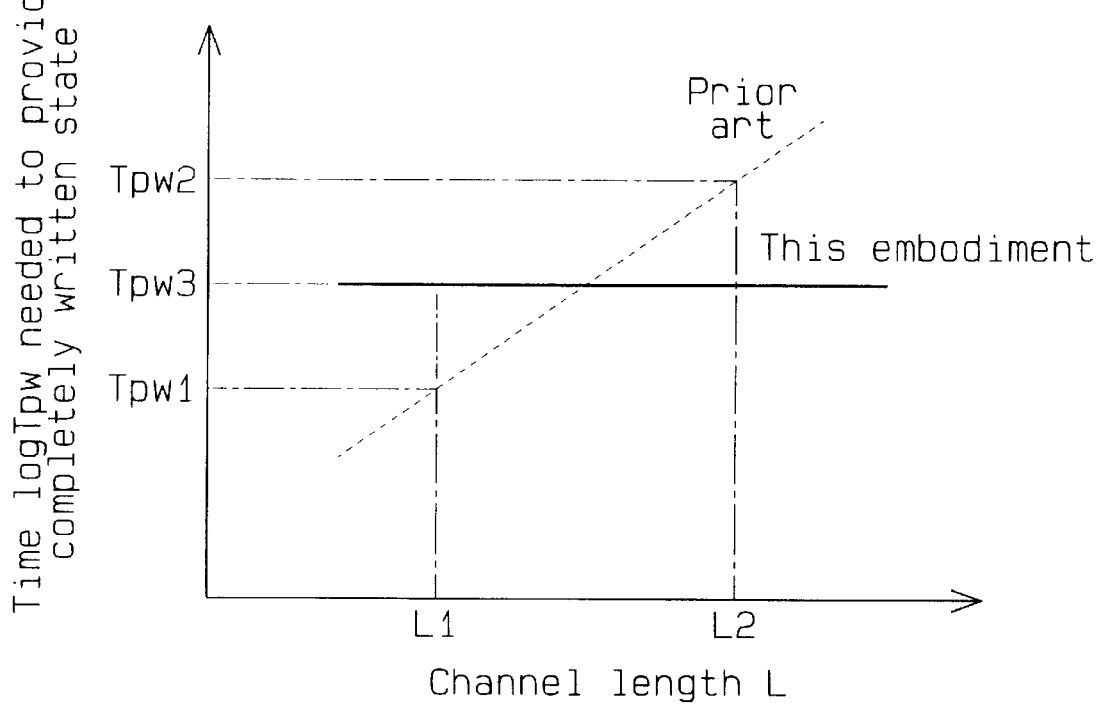
FIG. 15 is a graph showing the relationship between the channel length and the time needed to provide the fully written state in the first embodiment.

FIG. 15 presents a characteristic graph showing the relationship between the channel length L and the time Tpw needed to provide the fully written state. The first embodiment is indicated by the solid line, and the prior art by the broken line. Even with a variation in channel length L caused by the positional deviations of the floating gate FG and the control gate CG, the times Tpw needed to provide the completely written state for the different channel lengths become substantially constant. It is thus possible to precisely control the floating gate potentials Vfg of the memory cells after writing. In other words, the amount of charges to be stored in the floating gate FG can be accurately controlled. This permits data writing to the memory cells to be precisely controlled and facilitates to ensuring an operation on a lower supply voltage and a multi-value storage operation. Advantageously, it is unnecessary to set the write operation time Tpw longer in order to make the floating gate potential Vfg constant, thus preventing the writing speeds from becoming slower and power consumption from increasing.

Figure 16:
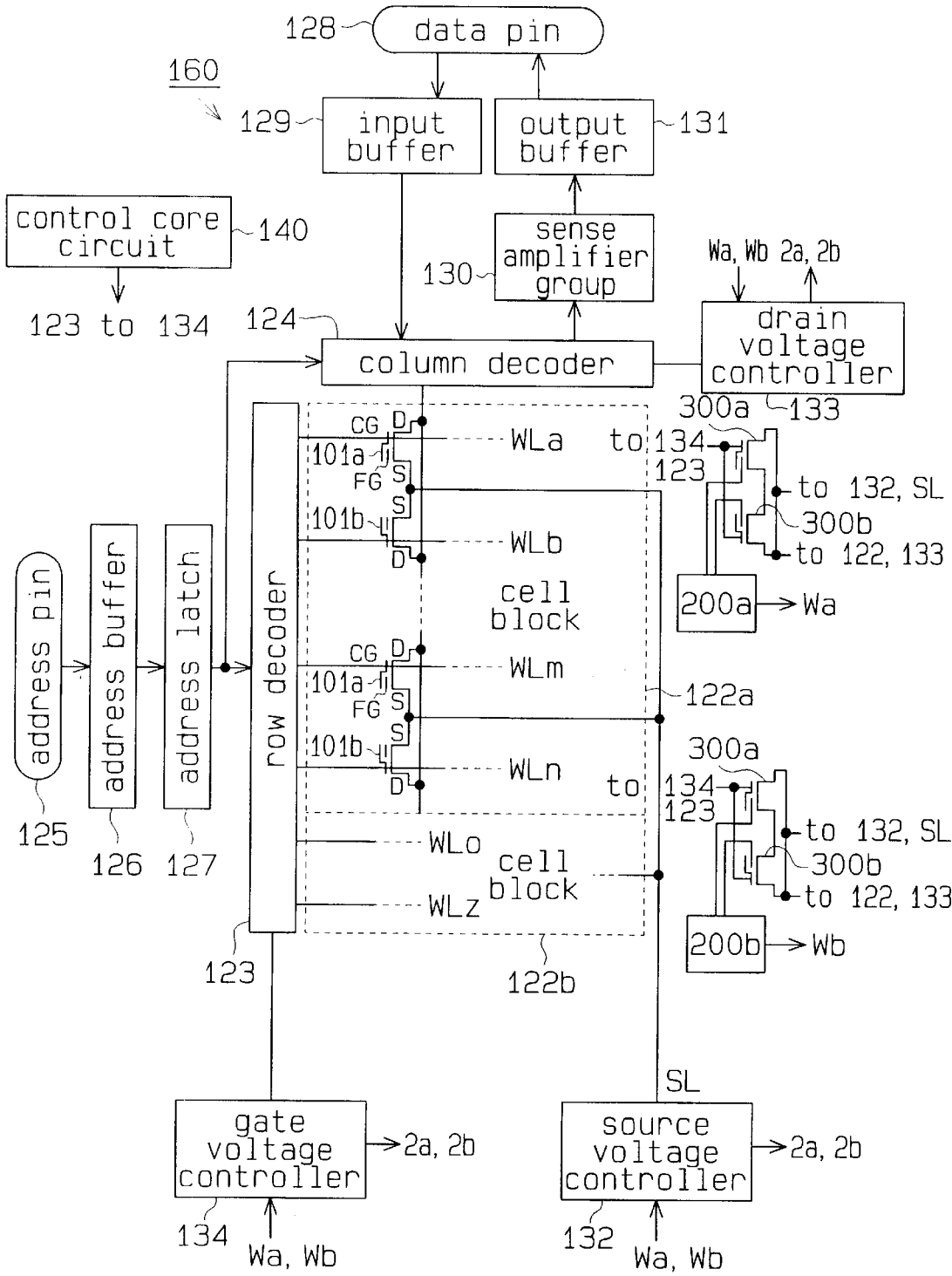
FIG. 16 is a block diagram of a flash EEPROM according to the second embodiment of the invention.

A split gate flash EEPROM according to a second embodiment of this invention will now be described with reference to the accompanying drawings. To avoid a redundant description, like or same reference numerals are given to those components which are the same as the corresponding components of the first embodiment. FIG. 16 is a block diagram showing a flash EEPROM 160 according to the second embodiment. This flash EEPROM 160 of the second embodiment differs from the flash EEPROM 150 of the first embodiment in the following three points.

(1) The memory cell array 122 includes a first cell block 122a, which is comprised of memory cells 101a and 101b connected to the word lines WLa-WLn, and a second cell block 122b, which is comprised of memory cells (not shown) connected to the word lines WLo-WLz.

(2) Write-current determining circuits 200a and 200b and the reference cells 300a and 300b are respectively provided for the cell blocks 122a and 122b. The reference cells 300a and 300b are formed in the vicinity of the first cell block 122a during the same process steps used in forming the memory cells 101a and 101b in the first cell block 122a and with the same dimensions as the memory cells 101a and 101b. The two reference cells 300a and 300b are likewise formed in the vicinity of the second cell block 122b during the same process steps used in forming the memory cells (not shown) in the second cell block 122b and with the same dimensions as those memory cells.

(3) When memory cells in the first cell block 122a are selected in the writing operation, the individual voltage controllers 132–134 operate in accordance with a control signal Wa from the comparator (not shown) in the write-current determining circuit 200a. When memory cells in the second cell block 122b are selected, on the other hand, the individual voltage controllers 132–134 operate in accordance with a control signal Wb from the comparator (not shown) in the write-current determining circuit 200b.

The second embodiment can have the same advantages for each of the cell blocks 122a and 122b as those of the first embodiment. Even if the channel lengths L in each cell block 122a or 122b vary, the constant write current Ifg can be acquired. To fabricate a memory cell array with a large area, the memory cell array is divided to a plurality of cell blocks. The lithography step for forming the floating gate FG and the control gate CG is performed for each cell block. Preferably, the same reticle is used for the individual cell blocks in the lithography steps. Due to errors in alignment of the reticle, the degree of a variation in the channel lengths L1 and L2 in the first cell block 122a may differ from the degree of a variation in the channel lengths L1 and L2 in the second cell block 122b.

Even in such a case, however, the constant write current Ifg can be acquired for each of the cell blocks 122a and 122b in the second embodiment. This permits the write operation time Tpw to be averaged for all the memory cells 101 in the memory cell array 122. It is thus possible to precisely control the floating gate potentials Vfg of the memory cells after writing. In other words, the written states of the memory cells can be accurately controlled irrespective of a variation in the characteristics of the memory cells in the memory cell array. This invention can be effectively adapted to a large memory cell array or a large-capacity flash EEPROM. This invention may be adapted to a memory cell array which is divided to two or more cell blocks in accordance with the bit lines or the source lines instead of the word lines.

Although only two embodiments of the present invention have been described herein, it should be apparent to those skilled in the art that the present invention may be embodied in many other specific forms without departing from the spirit or scope of the invention. Particularly, it should be understood that the invention may be embodied in the following forms.

In the first and second embodiments, the split gate memory cells 201 shown in FIG. 8 may be used in place of the split gate memory cells 101. In this case, the source voltage controller 132 would be omitted and the common source line SL would be grounded.

In the first and second embodiments, the source voltage controller 132 may be replaced with a source current controller. In this case, the source current controller preferably controls the cell current value Id to a constant value so that the voltages applied to the individual source lines RSLa-RSLm via the common source line SL are controlled in accordance with the individual operation modes as shown in FIG. 7.

In the first and second embodiments, the drain voltage controller 133 may be replaced with a drain current controller. In this case, the drain current controller controls the cell current value Id to a constant value so that the voltage applied to the bit line BLm is controlled in accordance with the individual operation modes as shown in FIG. 7 or 10.

The first and second embodiments may further be provided with a source line decoder which selects one source line according to the column address and connects the selected source line to the source voltage controller 132.

Therefore, the present examples and embodiments are to be considered as illustrative and not restrictive and the invention is not to be limited to the details given herein, but may be modified within the scope and equivalence of the appended claims.

What is claimed is:

1. A non-volatile semiconductor memory device comprising:
   a plurality of memory cells each having a control gate, a source, a drain and a floating gate;
   a write control unit for controlling voltages applied to said control gates, said sources and said drains to write data in each memory cell; and
   a write-current determining circuit, connected to said write control unit, for determining a write current flowing in said floating gate of each memory cell and controlling said write control unit in accordance with a determination result such that data is written in each memory cell with a predetermined write current.

2. The non-volatile semiconductor memory device according to claim 1, further comprising at least one reference memory cell having a same size as one of said plurality of memory cells, and having a control gate, a source, a drain and a floating gate;
   wherein said write control unit controls voltages applied to said control gate, source and drain of said reference memory cell in a same manner as for those of said memory cells; and
   wherein said write-current determining circuit determines a write current flowing in said floating gates of said reference memory cell and controls said write control unit in accordance with a determination result of said reference memory cell such that data is written in each memory cell with said predetermined write current.

3. The non-volatile semiconductor memory device according to claim 1, further comprising at least one reference memory cell having a same size as one of said plurality of memory cells, and having a control gate, a source, a drain and a floating gate;
   wherein said write control unit controls voltages applied to said control gate, source and drain of said reference memory cell in a same manner as done for those of said memory cells; and
   wherein said write-current determining circuit compares a write current flowing in said floating gate of said reference memory cell with a reference write current and controls said write control unit in accordance with a comparison result such that a write current for each memory cell becomes substantially equal to said reference write current.

4. The non-volatile semiconductor memory device according to claim 1, further comprising a memory cell array having said plurality of memory cells arranged in a matrix form, said memory cell array being divided into a plurality of memory cell blocks each having a plurality of memory cells; and
   wherein said write-current determining circuit is provided for each of said memory cell blocks.

5. The non-volatile semiconductor memory device according to claim 1, wherein said write control unit includes:
   a source voltage controller for controlling a voltage applied to said source of each memory cell;
   a drain voltage controller for controlling a voltage applied to said drain of each memory cell; and
   a gate voltage controller for controlling a voltage applied to said control gate of each memory cell.

6. The non-volatile semiconductor memory device according to claim 1, wherein said write control unit includes:
   a source current controller for controlling a current flowing in said source of each memory cell to control a voltage applied to said source of said each memory cell;
   a drain voltage controller for controlling a voltage applied to said drain of each memory cell; and
   a gate voltage controller for controlling a voltage applied to said control gate of each memory cell.

7. The non-volatile semiconductor memory device according to claim 1, wherein said write control unit includes:
   a source voltage controller for controlling a voltage applied to said source of each memory cell;
   a drain current controller for controlling a current flowing in said drain of each memory cell to control a voltage applied to said drain of said each memory cell; and
   a gate voltage controller for controlling a voltage applied to said control gate of each memory cell.

8. The non-volatile semiconductor memory device according to claim 1, wherein said memory cells are of a split gate type.

9. A non-volatile semiconductor memory device comprising:
   a plurality of memory cells each having a control gate, a source, a drain and a floating gate;
   a write control unit controlling voltages applied to at least one of said control gates, said sources and said drains to write data in each memory cell; and
   an electric potential determining circuit, connected to said write control unit, for determining an electric potential of said floating gate of each memory cell and controlling said write control unit in accordance with a determination result such that data is written in each memory cell with a predetermined electric potential, wherein said write control unit dynamically adjusts said voltages applied to at least one of said control gates, said sources and said drains in response to said determination result to achieve said predetermined electric potential.

10. The non-volatile semiconductor memory device according to claim 9, further comprising at least one reference memory cell having a same size as one of said plurality of memory cell, and having a control gate, a source, a drain and a floating gate;

wherein said write control unit controls voltages applied to said control gate, source and drain of said reference memory cell in a same manner as done for those of said memory cells; and wherein said electric potential determining circuit determines an electric potential of said floating gate of said reference memory cell and controls said write control unit in accordance with a determination result of said reference memory cell such that data is written in each memory cell with said predetermined electric potential.

11. The non-volatile semiconductor memory device according to claim 9, further comprising at least one reference memory cell having a same size as one of said plurality of memory cells, and having a control gate, a source, a drain and a floating gate;

wherein said write control unit controls voltages applied to said control gate, source and drain of said reference memory cell in a same manner as done for those of said memory cells; and wherein said electric potential determining circuit compares an electric potential of said floating gate of said reference memory cell with a reference electric potential and controls said write control unit in accordance with a comparison result such that an electric potential of said floating gate of each memory cell becomes substantially equal to said reference electric potential.

12. The non-volatile semiconductor memory device according to claim 9, further comprising a memory cell array having said plurality of memory cells arranged in a matrix form, said memory cell array being divided into a plurality of memory cell blocks each having a plurality of memory cells; and wherein said write-current determining circuit is provided for each of said memory cell blocks.

13. The non-volatile semiconductor memory device according to claim 9, wherein said write control unit includes:

a source voltage controller for controlling a voltage applied to said source of each memory cell;

a drain voltage controller for controlling a voltage applied to said drain of each memory cell; and a gate voltage controller for controlling a voltage applied to said control gate of each memory cell.

14. The non-volatile semiconductor memory device according to claim 9, wherein said write control unit includes:

a source current controller for controlling a current flowing in said source of each memory cell to control a voltage applied to said source of said each memory cell;

a drain voltage controller for controlling a voltage applied to said drain of each memory cell; and a gate voltage controller for controlling a voltage applied to said control gate of each memory cell.

15. The non-volatile semiconductor memory device according to claim 9 wherein said write control unit includes:

a source voltage controller for controlling a voltage applied to said source of each memory cell;

a drain current controller for controlling a current flowing in said drain of each memory cell to control a voltage applied to said drain of said each memory cell; and a gate voltage controller for controlling a voltage applied to said control gate of each memory cell.

16. The non-volatile semiconductor memory device according to claim 9, wherein said memory cells are of a split gate type.

17. A non-volatile semiconductor memory device comprising:

a plurality of memory cells each having a control gate, a source, a drain and a floating gate;

a write control unit controlling voltages applied to at least one of said control gates, said sources and said drains to write data in each memory cell; and a cell current determining circuit, connected to said write control unit, for determining a cell current flowing in each memory cell and controlling said write control unit in accordance with a determination result such that data is written in each memory cell with a predetermined cell current, wherein said write control unit dynamically adjusts said voltages applied to at least one of said control gates, said sources and said drains in response to said determination result to achieve said predetermined cell current.

18. The non-volatile semiconductor memory device according to claim 17, further comprising at least one reference memory cell having a same size as one of said plurality of memory cell, and having a control gate, a source, a drain and a floating gate;

wherein said write control unit controls voltages applied to said control gate, source and drain of said reference memory cell in a same manner as done for those of said memory cells; and wherein said cell current determining circuit determines a cell current flowing in said reference memory cell and controls said write control unit in accordance with a determination result of said reference memory cell such that data is written in each memory cell with said predetermined cell current.

19. The non-volatile semiconductor memory device according to claim 17, further comprising at least one reference memory cell having a same size as one of said plurality of memory cells, and having a control gate, a source, a drain and a floating gate;

wherein said write control unit controls voltages applied to said control gate, source and drain of said reference memory cell in a same manner as done for those of said memory cells; and wherein said cell current determining circuit compares a cell current flowing in said reference memory cell with a reference cell current and controls said write control unit in accordance with a comparison result such that a cell current flowing in each memory cell becomes substantially equal to said reference cell current.

20. The non-volatile semiconductor memory device according to claim 17, further comprising a memory cell array having said plurality of memory cells arranged in a matrix form, said memory cell array being divided into a plurality of memory cell blocks each having a plurality of memory cells; and wherein said write-current determining circuit is provided for each of said memory cell blocks.

21. The non-volatile semiconductor memory device according to claim 17, wherein said write control unit includes:

a source voltage controller for controlling a voltage applied to said source of each memory cell;

a drain voltage controller for controlling a voltage applied to said drain of each memory cell; and a gate voltage controller for controlling a voltage applied to said control gate of each memory cell.

22. The non-volatile semiconductor memory device according to claim 17, wherein said write control unit includes:

a source current controller for controlling a current flowing in said source of each memory cell to control a voltage applied to said source of said each memory cell;

a drain voltage controller for controlling a voltage applied to said drain of each memory cell; and a gate voltage controller for controlling a voltage applied to said control gate of each memory cell.

23. The non-volatile semiconductor memory device according to claim 17 wherein said write control unit includes:

a source voltage controller for controlling a voltage applied to said source of each memory cell;

a drain current controller for controlling a current flowing in said drain of each memory cell to control a voltage applied to said drain of said each memory cell; and a gate voltage controller for controlling a voltage applied to said control gate of each memory cell.

24. The non-volatile semiconductor memory device according to claim 17, wherein said memory cells are of a split gate type.

25. An improved non-volatile semiconductor memory device having a source voltage controller, a drain voltage controller, a gate voltage controller and a memory array including a plurality of memory cells, wherein the improvement comprises:

a reference cell having a source, a drain and a control gate respectively connected to the source voltage controller, the drain voltage controller and the gate voltage controller such that the same voltages applied to the source, drain and control gate of a selected memory cell are applied to the source, drain and control gate of the reference cell; and a write current determining circuit for comparing a write current which flows to a substrate from a floating gate of the reference cell to a reference current and generating a control signal therefrom for controlling at least one of the source, drain and control gate voltage controllers such that the write current and the reference current become substantially equal.

26. A non-volatile semiconductor memory device comprising:

a plurality of memory cells each having a control gate, a source, a drain and a floating gate;

a write control unit controlling voltages applied to at least one of said control gates, said sources and said drains to write data in each memory cell;

a write-current determining circuit, connected to said write control unit, for determining a write current flowing in said floating gate of each memory cell and controlling said write control unit in accordance with a determination result such that data is written in each memory cell with a predetermined write current; and at least one reference memory cell having a same size as one of said plurality of memory cells, and having a control gate, a source, a drain and a floating gate;

wherein said write control unit controls voltages applied to said control gate, source and drain of said reference memory cell in same manner as for those of said memory cells; and wherein said write-current determining circuit determines a write current flowing in said floating gates of said reference memory cell and controls said write control unit in accordance with a determination result of said reference memory cell such that data is written in each memory cell with said predetermined write current.

27. A non-volatile semiconductor memory device comprising:

a plurality of memory cells each having a control gate, a source, a drain and a floating gate;

a write control unit controlling voltages applied to at least one of said control gates, said sources and said drains to write data in each memory cell; and a write-current determining circuit, connected to said write control unit, for determining a write current flowing in said floating gate of each memory cell and controlling said write control unit in accordance with a determination result such that data is written in each memory cell with a predetermined write current; and at least one reference memory cell having a same size as one of said plurality of memory cells, and having a control gate, a source, a drain and a floating gate;

wherein said write control unit controls voltages applied to said control gate, source and drain of said reference memory cell in a same manner as done for those of said memory cells; and wherein said write-current determining circuit compares a write current flowing in said floating gate of said reference memory cell with a reference write current and controls said write control unit in accordance with a comparison result such that a write current for each memory cell becomes substantially equal to said reference write current.

28. A non-volatile semiconductor memory device comprising:

a plurality of memory cells each having a control gate, a source, a drain and a floating gate;

a write control unit controlling voltages applied to at least one of said control gates, said sources and said drains to write data in each memory cell;

an electric potential determining circuit, connected to said write control unit, for determining an electric potential of said floating gate of each memory cell and controlling said write control unit in accordance with a determination result such that data is written in each memory cell with a predetermined electric potential; and at least one reference memory cell having a same size as one of said plurality of memory cell, and having a control gate, a source, a drain and a floating gate;

wherein said write control unit controls voltages applied to said control gate, source and drain of said reference memory cell in a same manner as done for those of said memory cells; and wherein said electric potential determining circuit determines an electric potential of said floating gate of said reference memory cell and controls said write control unit in accordance with a determination result of said reference memory cell such that data is written in each memory cell with said predetermined electric potential.

29. A non-volatile semiconductor memory device comprising:

a plurality of memory cells each having a control gate, a source, a drain and a floating gate;

a write control unit controlling voltages applied to at least one of said control gates, said sources and said drains to write data in each memory cell; and an electric potential determining circuit, connected to said write control unit, for determining an electric potential of said floating gate of each memory cell and controlling said write control unit in accordance with a determination result such that data is written in each memory cell with a predetermined electric potential; and at least one reference memory cell having a same size as one of said plurality of memory cells, and having a control gate, a source, a drain and a floating gate;

wherein said write control unit controls voltages applied to said control gate, source and drain of said reference memory cell in a same manner as done for those of said memory cells; and wherein said electric potential determining circuit compares an electric potential of said floating gate of said reference memory cell with a reference electric potential and controls said write control unit in accordance with a comparison result such that an electric potential of said floating gate of each memory cell becomes substantially equal to said reference electric potential.

30. A non-volatile semiconductor memory device comprising:

a plurality of memory cells each having a control gate, a source, a drain and a floating gate;

a write control unit controlling voltages applied to at least one of said control gates, said sources and said drains to write data in each memory cell;

a cell current determining circuit, connected to said write control unit, for determining a cell current flowing in each memory cell and controlling said write control unit in accordance with a determination result such that data is written in each memory cell with a predetermined cell current; and at least one reference memory cell having a same size as one of said plurality of memory cell, and having a control gate, a source, a drain and a floating gate;

wherein said write control unit controls voltages applied to said control gate, source and drain of said reference memory cell in a same manner as done for those of said memory cells; and wherein said cell current determining circuit determines a cell current flowing in said reference memory cell and controls said write control unit in accordance with a determination result of said reference memory cell such that data is written in each memory cell with said predetermined cell current.

31. A non-volatile semiconductor memory device comprising:

a plurality of memory cells each having a control gate, a source, a drain and a floating gate;

a write control unit controlling voltages applied to at least one of said control gates, said sources and said drains to write data in each memory cell; and a cell current determining circuit, connected to said write control unit, for determining a cell current flowing in each memory cell and controlling said write control unit in accordance with a determination result such that data is written in each memory cell with a predetermined cell current; and at least one reference memory cell having a same size as one of said plurality of memory cells, and having a control gate, a source, a drain and a floating gate;

wherein said write control unit controls voltages applied to said control gate, source and drain of said reference memory cell in a same manner as done for those of said memory cells; and wherein said cell current determining circuit compares a cell current flowing in said reference memory cell with a reference cell current and controls said write control unit in accordance with a comparison result such that a cell current flowing in each memory cell becomes substantially equal to said reference cell current.

* * * * *